United States Patent [19]

Isaak

[11] Patent Number: 5,621,193
[45] Date of Patent: Apr. 15, 1997

[54] CERAMIC EDGE CONNECT PROCESS

[75] Inventor: Harlan R. Isaak, Costa Mesa, Calif.

[73] Assignee: Northrop Grumman Corporation, Los Angeles, Calif.

[21] Appl. No.: 447,831

[22] Filed: May 23, 1995

[51] Int. Cl.$^6$ .................................................. H05K 1/11
[52] U.S. Cl. ....................... 174/262; 174/264; 439/78; 361/778; 29/842; 29/852
[58] Field of Search .................................. 174/261, 262, 174/264, 265, 266; 361/774, 778, 779; 439/78, 59; 29/842, 845, 852, 883, 874

[56] References Cited

U.S. PATENT DOCUMENTS

| | | | |
|---|---|---|---|
| 3,185,947 | 5/1965 | Freymodsson | 336/200 |
| 3,798,762 | 3/1974 | Harris et al. | 29/626 |
| 4,168,992 | 9/1979 | Anthony et al. | 148/1.5 |
| 4,170,490 | 10/1979 | Anthony et al. | 148/1.5 |
| 4,170,496 | 10/1979 | Anthony et al. | 148/33 |
| 4,304,624 | 12/1981 | Carson et al. | 156/630 |
| 4,354,107 | 10/1982 | Carson et al. | 250/239 |
| 4,372,046 | 2/1983 | Suzuki | 29/852 |
| 4,400,762 | 8/1983 | Bartley | 361/402 |
| 4,403,238 | 9/1983 | Clark | 357/30 |
| 4,437,141 | 3/1984 | Prokop | 361/403 |
| 4,544,577 | 10/1985 | May | 427/97 |
| 4,551,629 | 11/1985 | Carson et al. | 250/578 |
| 4,618,763 | 10/1986 | Schmitz | 250/211 R |
| 4,646,128 | 2/1987 | Carson et al. | 357/74 |
| 4,703,170 | 10/1987 | Schmitz | 250/211 R |
| 4,706,166 | 11/1987 | Go | 361/403 |
| 4,764,846 | 8/1988 | Go | 361/388 |
| 4,784,970 | 11/1988 | Solomon | 437/51 |
| 4,792,672 | 12/1988 | Schmitz | 250/211 |
| 4,794,092 | 12/1988 | Solomon | 437/51 |
| 4,821,007 | 4/1989 | Fields et al. | 333/238 |
| 4,857,477 | 8/1989 | Kanamori | 437/47 |
| 4,870,031 | 9/1989 | Sugahara et al. | 437/82 |
| 4,907,128 | 3/1990 | Solomon et al. | 361/412 |
| 4,908,940 | 3/1990 | Amano et al. | 29/852 |
| 4,956,694 | 9/1990 | Elde | 357/74 |
| 4,964,947 | 10/1990 | Yarita et al. | 156/645 |
| 4,978,420 | 12/1990 | Bach | 156/643 |
| 4,988,641 | 1/1991 | Solomon | 437/83 |
| 4,992,393 | 2/1991 | Kosaka et al. | 437/83 |
| 4,992,908 | 2/1991 | Solomon | 361/400 |
| 5,010,025 | 4/1991 | Solomon | 437/29 |
| 5,013,687 | 5/1991 | Solomon | 437/209 |
| 5,013,919 | 5/1991 | Solomon | 250/349 |
| 5,030,828 | 7/1991 | Solomon | 250/338.4 |
| 5,036,203 | 7/1991 | Solomon | 250/370.06 |
| 5,045,907 | 9/1991 | Solomon | 357/30 |
| 5,053,350 | 10/1991 | Solomon | 437/47 |
| 5,064,771 | 11/1991 | Solomon | 437/3 |
| 5,067,233 | 11/1991 | Solomon | 29/852 |
| 5,075,201 | 12/1991 | Koh | 430/321 |
| 5,075,238 | 12/1991 | Solomon | 437/3 |
| 5,093,708 | 3/1992 | Solomon | 357/68 |
| 5,108,938 | 4/1992 | Solomon | 437/41 |
| 5,122,851 | 6/1992 | Solomon | 357/30 |
| 5,128,749 | 7/1992 | Hornback et al. | 357/80 |
| 5,135,556 | 8/1992 | Horback et al. | 65/43 |
| 5,138,164 | 8/1992 | Koh | 250/339 |
| 5,140,745 | 8/1992 | McKenzie, Jr. | 29/852 |
| 5,149,671 | 9/1992 | Koh et al. | 437/183 |
| 5,208,478 | 5/1993 | Solomon | 257/443 |
| 5,209,798 | 5/1993 | Solomon et al. | 156/153 |

(List continued on next page.)

*Primary Examiner*—Laura Thomas
*Attorney, Agent, or Firm*—Stetina Brunda & Buyan

[57] ABSTRACT

A method for electrically connecting a surface conductor to an edge conductor on an intersecting side of a non-conductive substrate, includes the steps of forming a through-hole in the substrate, and metallizing the through-hole to form a conductive via. Then, the substrate through the via is cut to form an intersecting side. An electrical connection may be made between a surface conductor through the via to an edge conductor on the intersecting side of the substrate. A preferred embodiment further includes forming an insulating sealing plug in the via, prior to cutting the intersecting side. The above method provides an edge connection without the need to wrap a conductive conduit around the corner of the substrate. Such wrap-around conduits are vulnerable to damage during subsequent handling of the substrate.

6 Claims, 2 Drawing Sheets

U.S. PATENT DOCUMENTS

| | | | |
|---|---|---|---|
| 5,231,304 | 7/1993 | Solomon | 257/684 |
| 5,276,963 | 1/1994 | Flanders | 29/852 |
| 5,286,926 | 2/1994 | Kimura et al. | 174/250 |
| 5,308,645 | 5/1994 | Zachman et al. | 427/97 |
| 5,315,147 | 4/1994 | Solomon | 257/448 |
| 5,322,565 | 6/1994 | Zachman et al. | 118/500 |
| 5,383,095 | 1/1995 | Korsunsky et al. | 361/785 |
| 5,393,696 | 2/1995 | Koh et al. | 437/183 |

CERAMIC EDGE CONNECT PROCESS

FIELD OF THE INVENTION

The present invention relates generally to multi-layered integrated circuit modules and metallized through-hole via interconnects, and more particularly to electrical connections to conducting pads on the edges of the layers.

BACKGROUND OF THE INVENTION

Space-based surveillance systems use infrared detectors coupled to computerized data processors for monitoring heated objects and their movements in the atmosphere below and on the ground. The infrared spectrum covers a wide range of wavelengths, from about 0.75 micrometers to 1 millimeter. The function of infrared detectors is to respond to energy of a wavelength within some particular portion of the infrared region. Heated objects dissipate thermal energy having characteristic wavelengths within the infrared spectrum. Different levels of thermal energy, corresponding to different sources of heat, are characterized by the emission of signals within different portions of the infrared frequency spectrum. Detectors are selected in accordance with their sensitivity in the range of interest to the designer. Similarly, electronic circuitry that receives and processes the signals from the infrared detectors is also selected in view of the intended detection function.

Current infrared detection systems incorporate arrays of large numbers of discrete, highly sensitive detector elements the outputs of which are connected to sophisticated processing circuitry. By rapidly analyzing the pattern and sequence of detector element excitations, the processing circuitry can identify and monitor sources of infrared radiation. Though the theoretical performance of such systems is satisfactory for many applications, it is difficult to actually construct structures that mate a million or more detector elements and associated circuitry within a small area of about a square inch in a reliable and practical manner. Considerable difficulties are presented in aligning the detector elements with conductors on the connecting module and in isolating adjacent conductors in such a dense environment. Consequently, practical applications for contemporary infrared detection systems have necessitated that further advances be made in areas such as miniaturization of the detector array and accompanying circuitry, minimization of noise intermixed with the electrical signal generated by the detector elements, and improvements in the reliability and economical production of the detector array and accompanying circuitry.

Various constructions have been proposed to support the necessary connectivity and processing functions of the module. Those constructions have heretofore included the formation of a multi-layer passive substrate having metallized patterns formed thereon. Electronic devices such as integrated circuits are mounted on one or more of the substrate layers and connected to the metallized patterns to communicate signals between the electronic devices and the detector elements or external electronics. Conductive conduits formed upon opposite sides of each layer of such a multi-layer substrate are typically electrically interconnected by the use of conductive vias wherein a thin conductive film is sputter-coated into a through-hole interconnecting each side of the layer or substrate. Via interconnects with glass sealing plugs improve conductivity and enhance reliability of the conductive path. Glass sealing plugs also facilitate subsequent processing of the substrate wherein it is desirable to prevent fluid leakage from one side of the substrate to the other side thereof.

Some multi-layer module designs require a conduit to continue onto the edge of a substrate layer, for connection to adjacent modules or other external circuitry. Although "wrap around" connections have proven generally suitable for this purpose, they possess inherent deficiencies which detract from their overall effectiveness and desirability. The corner between the sides of the substrate is most susceptible to physical damage in subsequent processing and handling. In view of the shortcomings of wrap around connection, it is desirable to provide a more reliable electrical connection to conducting pads on the edges of substrate layers, using conventional integrated circuit manufacturing techniques.

SUMMARY OF THE INVENTION

The present invention generally comprises a method for establishing an electrical connection between conductors, (e.g., plate electrodes) mounted on adjacent intersecting surfaces of a substrate. The method comprises the steps of: a) forming a through-hole in a non-conductive substrate having upper and lower surfaces, said through-hole forming a hollow passageway through the substrate, from the upper surface thereof to the lower surface thereof, said passageway having opposing ends which form openings in the upper and lower surfaces of the substrate and an inside wall between the opposing ends; b) metallizing or otherwise depositing conductive material on the side wall(s) of the through-hole to form a conductive via; c) forming a cut through the substrate and through the conductive via to form an intersecting side which exposes the interior of the via; and, d) electrically connecting the exposed via to a conductor attached to or positioned adjacent the intersecting side of the substrate.

In accordance with one aspect of the invention, to provide an electrical connection around an edge of a substrate, through-holes are located in the substrate along where the edge is planned. The through-holes are metallized and preferably an insulating material is added, to form conductive vias having sealing plugs. The manufacturing method to provide the conductive vias with sealing plugs includes the steps of: applying an organometallic material to the through-hole; firing the organometallic material so as to form a via with a metallic coating upon the through-hole; filling the via with a liquified insulating material; firing the liquified insulating material so as to form a sealing plug within the via; and removing excess metallic and insulating material from the sides of the substrate.

In accordance with another aspect of the invention, the edge of the substrate may be cut at approximately a right angle to the upper and/or lower surfaces of the substrate, thereby forming a new outer edge which transects the vias so that some portion (e.g., approximately half of the vias remains embedded in the edge). At that point, electrical connections may be made between the ends of the via adjacent the upper and lower surfaces of the substrate, and the exposed portion of the via on the newly formed outer edge of the layer. Thus, the formation of the via in this manner eliminates the need to wrap conduits around the corner of the substrate.

These, as well as other advantages of the present invention will become more apparent from the following description and drawings. It is understood that changes in the specific structure shown and described may be made within the scope of the claims without departing from the spirit of the invention.

DETAILED DESCRIPTION OF THE PREFERRED EMBODIMENT

The detailed description set forth in connection with the appended drawings is intended as a description of the presently preferred embodiment of the present invention, and is not intended to represent the only form in which the present invention may be constructed or utilized. The description sets forth the function and sequence of steps for constructing and operating the invention in connection with the illustrated embodiment. It is to be understood, however, that the same or equivalent functions and sequences may be accomplished by different embodiments that are intended to be encompassed within the spirit and scope of the invention.

Figure 1A:
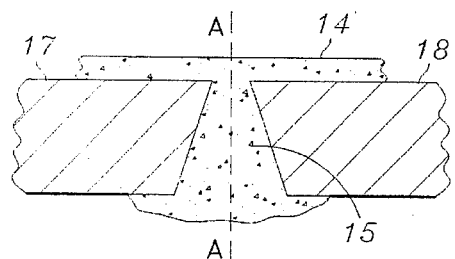
FIG. 1 is a series of views illustrating the process for forming metallized through-hole vias with insulating material sealing plugs, for use in accordance with the present invention.
Figure 1B:
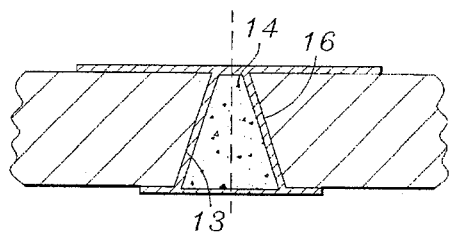
Figure 1C:
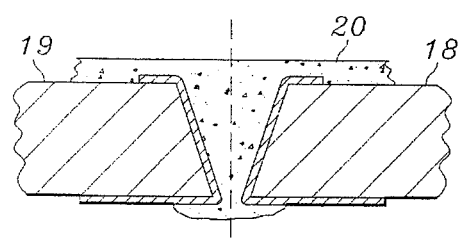
Figure 1D:
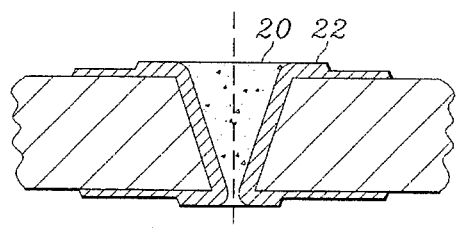
Figure 1E:
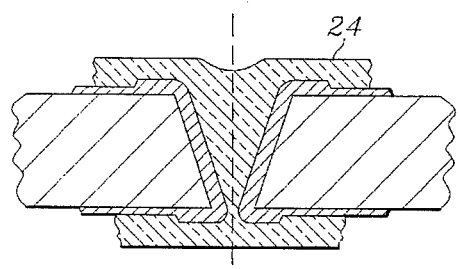
Figure 1F:
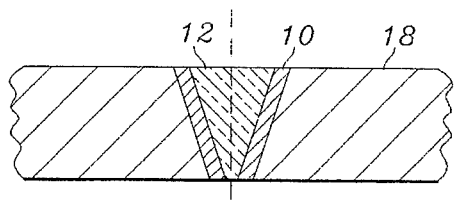

The manufacturing method for forming through-hole metallized via interconnects 10 with insulating material sealing plugs 12 for use in accordance with the present invention is illustrated in FIGS. 1a–f. FIG. 1a shows the organometallic material 14 preferably applied by screen printing over the through-hole 15 while simultaneously utilizing vacuum assist to pull the material 14 through the through-hole 15. FIG. 1b shows that after firing the organometallic material 14 (e.g., a gold containing organometallic compound) at a temperature of approximately 850° C., a metallic coating 16 (e.g., a gold coating) is thereby formed upon the inner wall 13 of the through-hole 15. FIG. 1c shows that optionally the substrate 18 has been inverted and a second organometallic material 20 is applied to the lower surface 19 of the substrate 18. FIG. 1d shows that after a second firing a second metallic coating 22 is formed upon the through-hole 15. FIG. 1e shows the insulating material 24, preferably high-temperature glass, applied to the via 12. The recommended material is ESL 4905 special fine particle glass available from Electro-Science Labs located in King of Prussia, Pa. Finally, FIG. 1f shows the excess material removed from both upper and lower surfaces 17 and 19 respectively of the substrate 18, preferably by lapping away the excess so the metallic coating 14 and 20 and insulating material 24 are flush with the opposing surfaces 17 and 19 of the substrate 18. The final plugged and lapped surfaces 17 and 19 may be cleaned by using an ultrasonic cleaning process.

Figure 2:
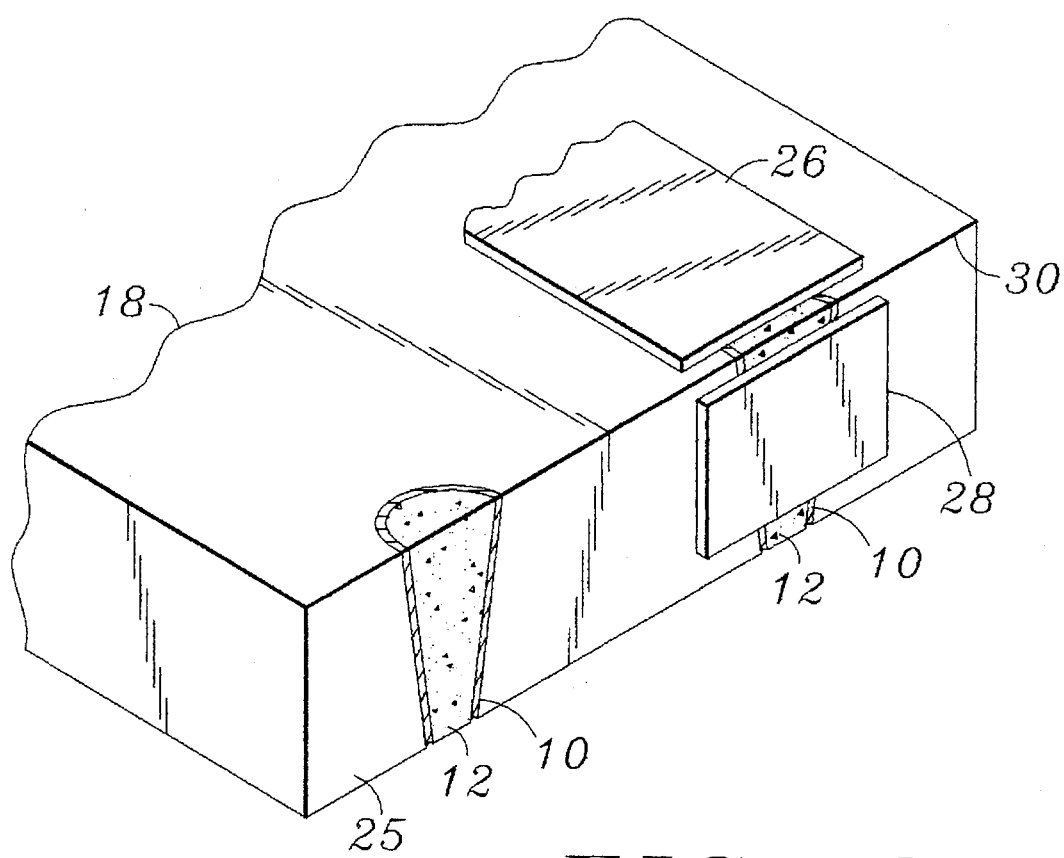
FIG. 2 is a perspective view of the intersecting edges of the substrate, with an electrical connection through the conductive via.

The through-holes 15 above are preferably laser drilled to accurately lie on the intersecting side 25 of the substrate 18. The through-holes 15 having a larger diameter on one end than the other is typical of holes formed by laser drilling, but other shapes, sizes and configurations of through-holes 15 may be fabricated. The axis A of the through-holes 15 is preferably approximately perpendicular to the upper surface 17 of the substrate 18. As shown in FIG. 2, the intersecting side 25 is cut so that approximately half the conductive via 10 and sealing plug 12 remain in the substrate 18. The angle of the intersecting side 25 is preferably approximately perpendicular to the upper surface 17 of the substrate 18. A surface conductor 26 may make contact to the half circle of metallic coating 16 at the end of the conductive via 10. An edge conductor 28 may make contact to the exposed metallic coating 16 of the conductive via 10, along the inner wall 13 of the through-hole 15 in the substrate 18. Inclusion of the half sealing plug 12 in the conductive via 10 provides a flush mounting surface for the edge conductor pad 28. The sealing plug 12 also eliminates an area where debris could collect. An electrical connection has been made through the conductive via 10 between the upper surface 17 and the intersecting side 25 of the substrate 18, without the need to wrap conduits around the corner 30 of the substrate 18.

It is understood that the exemplary edge connect process described herein and shown in the drawings represents only a presently preferred embodiment of the invention. Indeed, various modifications and additions may be made to the embodiment without departing from the spirit and scope of the invention. By way of example only, the through-hole 15 could be formed at a steep angle relative to the substrate 18 upper surface 17, or the intersecting side 25 could be cut at a steep angle relative to the substrate 18 upper surface 17. The opposing surfaces 17 and 19 need not be substantially parallel. These and other modifications and additions may be obvious to those skilled in the art and may be implemented to adapt the present invention for use in a variety of different applications.

What is claimed is:

1. A method for electrically connecting a surface conductor on a non-conductive planar substrate to an edge conductor on an intersecting side of the substrate, the method comprising the steps of:

a) forming a through-hole in a substrate;

b) metallizing the through-hole to form a conductive via c) cutting away a portion of the substrate to form an intersecting side which passes through the via;

d) electrically connecting the surface conductor on the substrate through the via to the edge conductor on the intersecting side of the substrate; and e) forming an insulating sealing plug that completely fills the via, and wherein the intersecting side passes through the via and the sealing plug.

2. The method of claim 1, wherein the portion of substrate is cut away such that the intersecting side is substantially parallel to a plane that includes the centerline of the through-hole.

3. The method of claim 1, wherein the portion of substrate is cut away such that the intersecting side is a plane that substantially includes the centerline of the through-hole.

4. An edge connection that electrically connects a surface conductor on a surface of a non-conductive planar substrate to an edge conductor on an intersecting side of the substrate, the edge connection comprising:

a) a substrate having material removed to form a void having an inner wall that extends from a surface of the substrate to an intersecting side of the substrate;

b) a layer of a metallization formed on at least a portion the inner wall, the metallization extending from the surface of the substrate to the intersecting side, the metallization electrically connected to the surface conductor and the edge conductor; and c) a sealing plug made of insulating material that completely fills the remainder of the void, and is approximately flush with the surface and the intersecting side of the substrate.

5. The edge connection of claim 4, wherein the substrate has opposing top and bottom surfaces that are substantially parallel.

6. The edge connection of claim 5, wherein the void is a through-hole substantially perpendicular to the top surface of the substrate.

\* \* \* \* \*